United States Patent
Kang et al.

(10) Patent No.: US 6,879,197 B2
(45) Date of Patent: Apr. 12, 2005

(54) APPARATUS FOR GENERATING DRIVING VOLTAGE FOR SENSE AMPLIFIER IN A MEMORY DEVICE

(75) Inventors: Chang Seok Kang, Kyoungki-do (KR); Sang Hee Kang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/699,722

(22) Filed: Nov. 3, 2003

(65) Prior Publication Data

US 2004/0251933 A1 Dec. 16, 2004

(30) Foreign Application Priority Data

Jun. 16, 2003 (KR) ................................ 10-2003-0038751

(51) Int. Cl.[7] ................................................ H03K 3/02
(52) U.S. Cl. ........................ 327/198; 327/530; 327/534
(58) Field of Search .......................... 327/112, 51, 198, 327/530, 52; 326/83, 85, 86, 87, 90, 91; 365/189.11, 49, 207

(56) References Cited

U.S. PATENT DOCUMENTS

| | | | |
|---|---|---|---|
| 5,610,872 A | 3/1997 | Toda | 365/230.06 |
| 5,689,473 A | 11/1997 | Toda | 365/233 |
| 5,740,097 A * | 4/1998 | Satoh | 365/49 |
| 6,002,162 A | 12/1999 | Takahashi et al. | 257/544 |
| 6,058,067 A | 5/2000 | Satani et al. | 365/230.06 |
| 6,188,596 B1 | 2/2001 | Holst | 365/63 |
| 6,373,766 B1 * | 4/2002 | Birk | 365/207 |
| 6,392,951 B2 | 5/2002 | Fujima et al. | 365/230.03 |
| 6,556,065 B1 | 4/2003 | Keeth et al. | 327/586 |
| 6,697,277 B2 * | 2/2004 | Towler et al. | 365/49 |
| 2001/0026474 A1 | 10/2001 | Fujima et al. | 209/260 |

FOREIGN PATENT DOCUMENTS

JP         9069287          3/1997

* cited by examiner

*Primary Examiner*—Tuan T. Lam
*Assistant Examiner*—Hiep Nguyen
(74) *Attorney, Agent, or Firm*—Ladas & Parry LLP

(57) ABSTRACT

The apparatus for generating a driving voltage for a sense amplifier has at least voltage output means, and first and second core voltage step-up means. The voltage output means outputs a voltage for driving the sense amplifier to a node. Each of the first and second core voltage step-up means are connected between a power supply and the node. The first and second core voltage step-up means are turned on in sequence to elevate the voltage level of the node connected with the sense amplifier up to the level of the power supply. This enhances the performance of the sense amplifier as well as the execute detection amplification in a short time period. The first and second core voltage step-up means are turned on in sequence to elevate the core voltage as the driving voltage, reducing the power noise. Each core voltage step-up driver may be installed in each bank to reduce power consumption.

6 Claims, 8 Drawing Sheets

APPARATUS FOR GENERATING DRIVING VOLTAGE FOR SENSE AMPLIFIER IN A MEMORY DEVICE

BACKGROUND OF THE INVENTION

1. Field of the Invention

The present invention relates to an apparatus for generating a driving voltage for a sense amplifier, in particular, which has an enhanced ability of generating a core voltage for the sense amplifier.

2. Description of the Prior Art

As well known in the art, a conventional method of reading data stored in a memory cell of a memory device such as DRAM, SDRAM and DDR SDRAM is performed as follows. A word line is primarily enabled to transfer electric charge stored in the memory cell into a bit line. Then, for example, the electric potential of the bit line is transited to a high potential level and the electric potential of a bit line bar is transited to a low potential level by using a sense amplifier, which serves to sense and amplify any minute potential difference between bit lines B/L, /B/L.

In this case, in a case that the potential difference between the bit lines increases more rapidly, the output time through a data output buffer becomes shorter to enable a high speed process of the memory device. In order to enlarge the potential difference between the bit lines in a short time period, the driving voltage of the sense amplifier is necessarily maintained high for a predetermined time period (that is, during sensing). In general, the voltage for driving the sense amplifier is a core voltage (which is typically equal to a voltage value where the data stored in the memory cell is at a high level).

FIG. 1 illustrates the connected relation between a core voltage driver 101 or means for generating a core voltage and a sense amplifier. As shown in FIG. 1, the sense amplifier uses a core voltage VCORE as a driving voltage. The core voltage driver 101 is typically arranged in a peripheral area 100 of a memory device (not shown), whereas the sense amplifier is typically arranged in a core area 120 of the memory device. For reference, the core area 120 includes a memory cell array of the memory device, whereas the peripheral area 100 refers to a portion of the memory device excluding the core area 120.

The operation of the circuit shown in FIG. 1 will be described in reference to FIG. 2 which illustrates an operation waveform of the circuit in FIG. 1.

Referring to FIG. 2, VDD indicates an external power supply, VCORE indicates an output voltage of the core voltage driver, and VBLP indicates a bit line precharge voltage. Also, ACTIVE indicates a signal enabled by a word line, and S/A Enable indicates a signal for enabling the sense amplifier.

As shown in FIG. 2, in the prior art, a bit line voltage temporarily drops to a predetermined value and then rises again while the voltage difference between bit lines is gradually increased by the enabled sense amplifier. As a result, a time delay is caused in a sensing operation.

FIG. 3 is a circuit embodied for solving these problems in the conventional circuit shown in FIG. 1. The circuit in FIG. 3 is arranged in a peripheral area 300 of a memory device, and comprises core voltage step-up drivers 301 and 302, that is, a core voltage step-up driver 301 and a core voltage step-up means 302 for stepping up the core voltage. The circuit in FIG. 3 has parts equal to those of the circuit in FIG. 1 except that the step-up means 302 steps up the core voltage. A sense amplifier is arranged in a core area 320.

As shown in FIG. 3, the core voltage step-up means 302 includes a PMOS transistor between an output node n1 of the core voltage driver and the power supply VDD, which is turned on/off in response to a sense amplifier enable-signal S/A Enable.

The operation of the circuit shown in FIG. 3 will be described in reference to FIG. 4 which is an operation waveform of the circuit shown in FIG. 3.

As shown in FIG. 3, when the PMOS transistor shown in FIG. 3 is turned on in response to the sense amplifier enable-signal S/A Enable during detection amplification, the power supply VDD is applied to the node n1. As can be seen in FIG. 4, this can prevent temporal step-down of a bit line voltage which was observed during detection amplification. (In reference, a range a in FIG. 4 corresponds to an operation range of the core voltage step-up means 302 in FIG. 3.)

However, the circuit shown in FIGS. 3 and 4 has drawbacks in that the core voltage is necessarily overdriven for a short period right after the operation of the sense amplifier thereby increasing power consumption. Also, power noise may occur according to power slopes thereby decreasing stability as well as deteriorating the yield of a wafer.

FIG. 5 illustrates an arrangement of core voltage step-up drivers in use for conventional memory banks. In this illustration, the core voltage step-up drivers 510 and 511 indicate those core voltage step-up drivers shown in FIG. 3. As shown in FIG. 5, two banks 501 and 503 share the core voltage step-up driver 510. Likewise, another two banks 502 and 503 share the core voltage step-up driver 511.

In the arrangement shown in FIG. 5, however, the core voltage step-up driver 510 powers both of the banks 501 and 502 even though only the bank 501 is operated. This creates a problem of consuming a large quantity of power.

SUMMARY OF THE INVENTION

Accordingly, the present invention has been made to solve the above-mentioned problems occurring in the prior art, and an object of the present invention is to provide a core voltage step-up driver, functioning to generate a driving voltage for a sense amplifier in a memory device, which can restrain power consumption and power noise occurring during operation of the sense amplifier as well as enhance the driving force of the sense amplifier.

In order to accomplish this object, there is provided an apparatus for generating a driving voltage for a sense amplifier in a memory device comprising: voltage output means for outputting a predetermined value of voltage for driving the sense amplifier to a node; a first core voltage step-up means connected between a power supply and the node; and a second core voltage step-up means connected between the power supply and the node, wherein the first and second core voltage step-up means are turned on in sequence to elevate the voltage level of the node connected with the sense amplifier up to the level of the power supply.

In the apparatus of the invention, the first core voltage step-up means includes a first transistor, the second core voltage step-up means includes a second transistor, the first core voltage step-up means is enabled in response to a bank active signal, and the second core voltage step-up means is enabled in response to a sense amplifier enable-signal.

It is preferred that the first transistor is smaller-sized than the second transistor.

In the apparatus of the invention, the voltage output means are inoperative when the first core voltage step-up means is enabled. Also, the voltage output means are arranged corresponding to each of the banks in the memory device.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the following detailed description will disclose an apparatus for generating a driving voltage for a sense amplifier in a memory device according to a preferred embodiment of the present invention with reference to the accompanying drawings.

Figure 6:
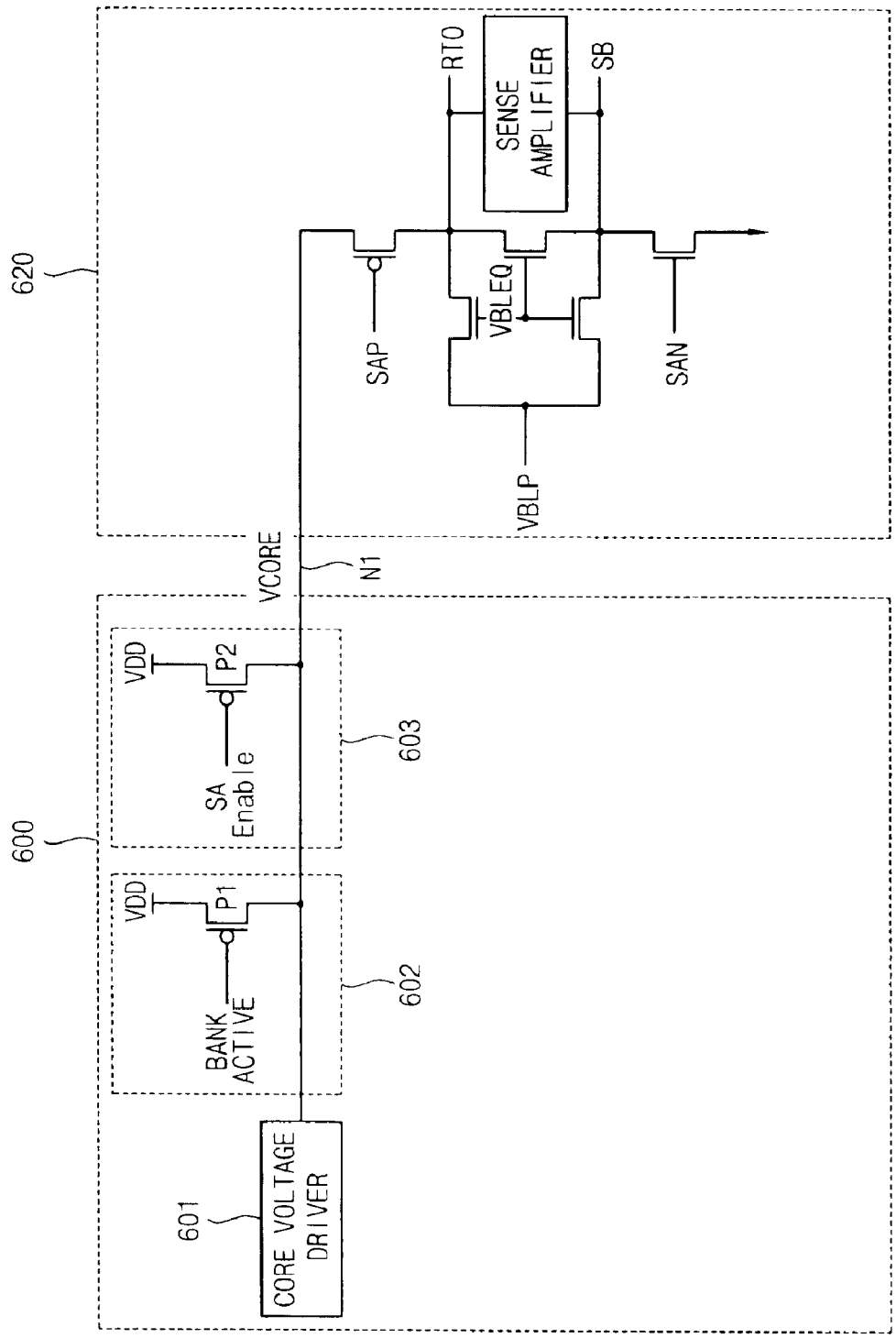
FIG. 6 is a circuit diagram illustrating an arrangement of a core voltage step-up driver for generating a driving voltage for a sense amplifier in a memory device and the sense amplifier according to the invention.

FIG. 6 is a circuit diagram illustrating an arrangement of a core voltage step-up driver for generating a driving voltage for a sense amplifier in a memory device and the sense amplifier according to the invention.

Referring to FIG. 6, the core voltage step-up driver includes a core voltage driver 601 or means for generating a core voltage, a first core voltage step-up means 602 and a second core voltage step-up means 603. The core voltage step-up driver is placed in a peripheral area 600, whereas the sense amplifier is placed in a core area 620.

Figure 1:
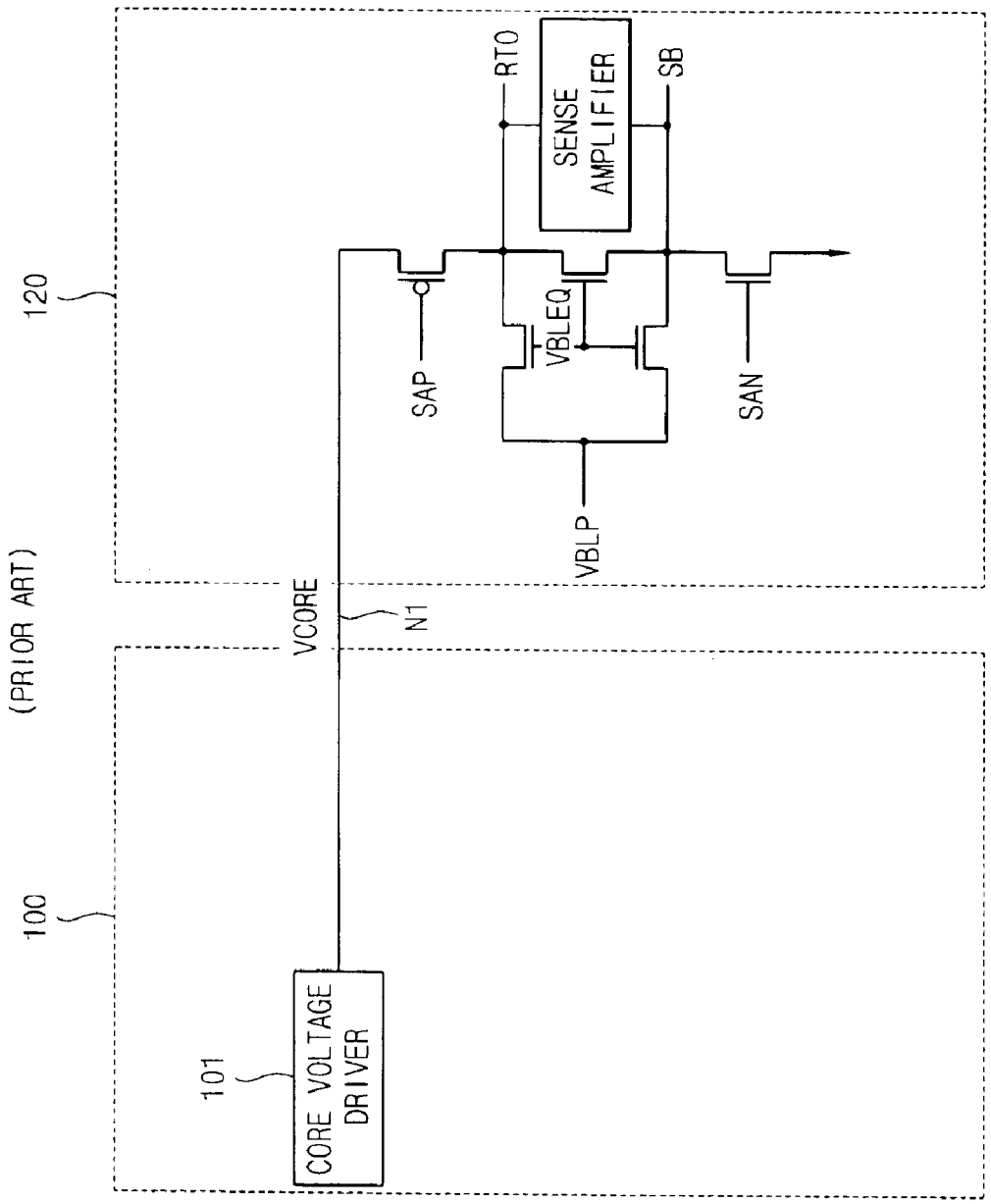
FIG. 1 is a circuit diagram illustrating the connection between a core voltage driver and a sense amplifier.
Figure 2:
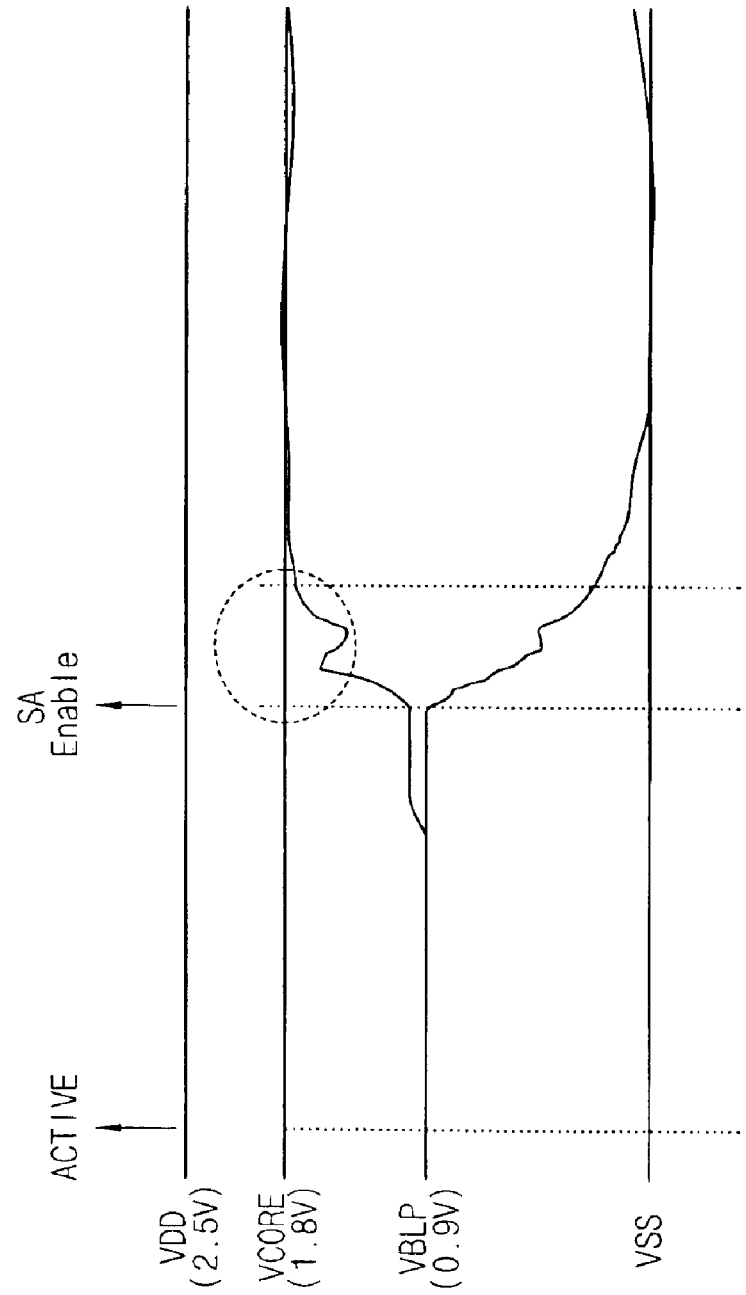
FIG. 2 illustrates an operation waveform of the circuit in FIG. 1.
Figure 3:
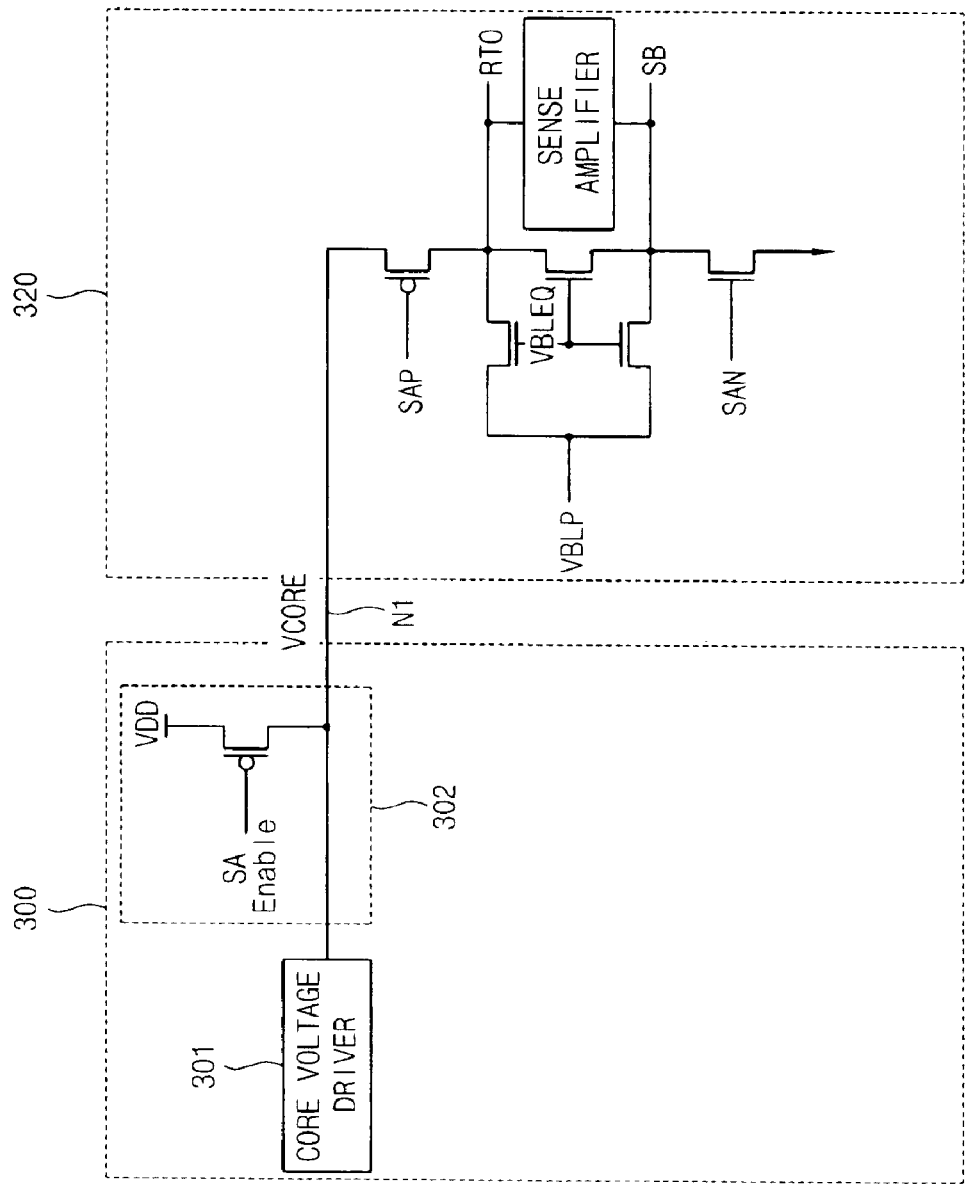
FIG. 3 is a circuit diagram illustrating the connection between another core voltage driver and a sense amplifier.
Figure 4:
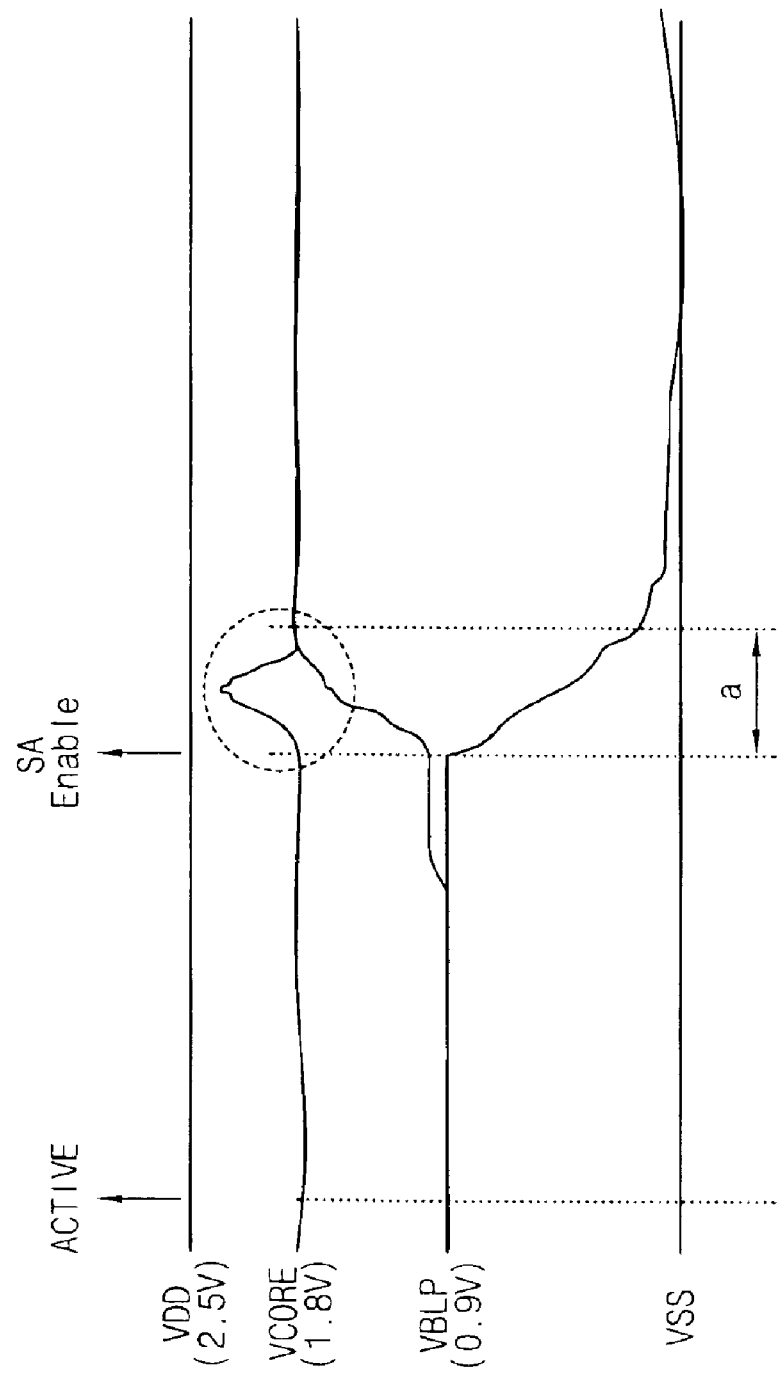
FIG. 4 illustrates an operation waveform of the circuit in FIG. 3.

The core voltage driver 601 outputs a predetermined value of core voltage (for example about 1.8V) into a node N1, and has a structure and a function substantially equal to those of the core voltage driver shown in FIGS. 1 and 3.

The first core voltage step-up means 602 includes a PMOS transistor P1 connected between a power supply VDD and the node N1, and is turned on/off in response to a bank active signal BANK ACTIVE.

The second core voltage step-up means 603 includes a PMOS transistor P2 connected between the power supply VDD and the node N1, and is turned on/off in response to a sense amplifier enable-signal S/A Enable.

In the present invention, the PMOS transistor P1 of the first core voltage step-up means 602 has a size smaller than that of the PMOS transistor P2 of the second core voltage step-up means 603. Herein the "size" means W/L ratio.

The operation of the circuit shown in FIG. 6 will be described in reference to FIG. 7 which illustrates an operation waveform of the circuit shown in FIG. 7.

Figure 7:
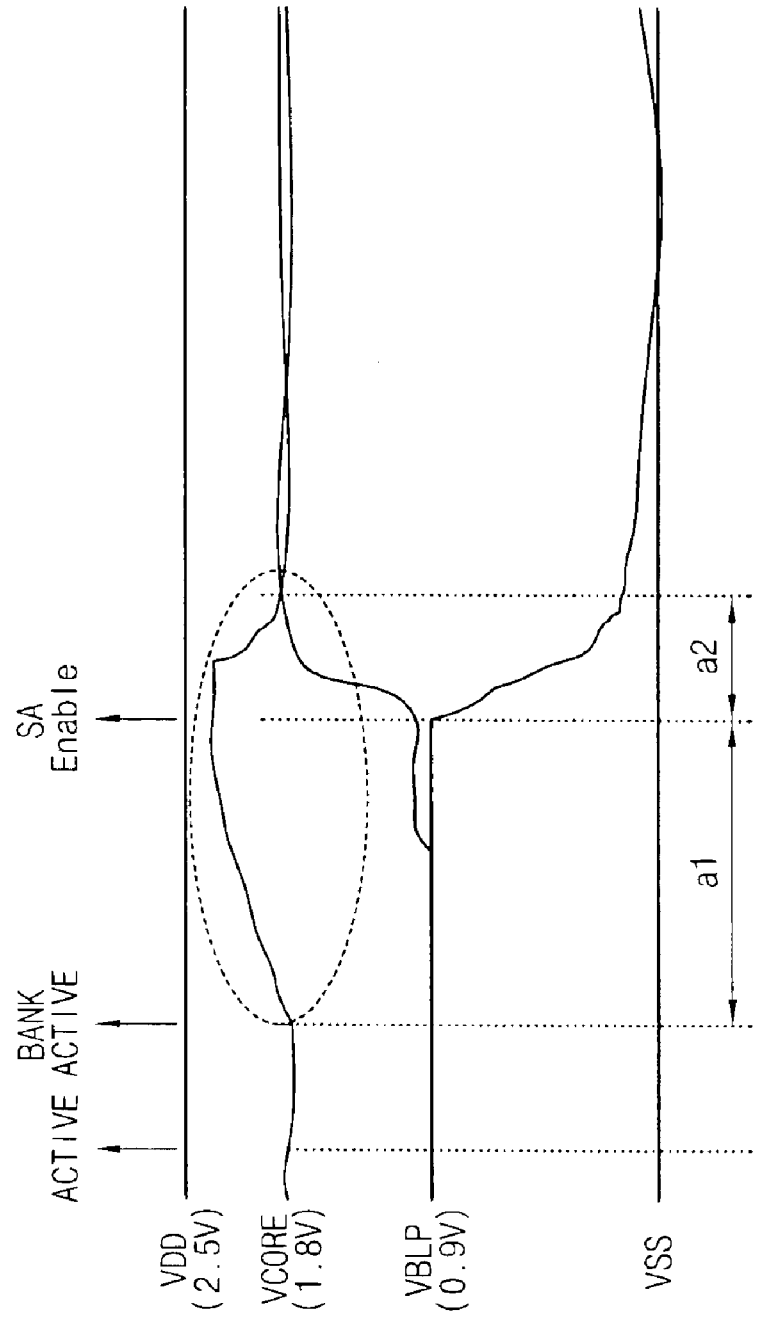
FIG. 7 illustrates an operation waveform of the circuit shown in FIG. 6.

As shown in FIG. 7, in application of an active signal ACTIVE for enabling a word line, the node N1 maintains a high level voltage (for example about 1.8V) by the core voltage driver 601.

When a bank active signal BANK ACTIVE is applied to enable the first core voltage step-up means 602, the operation of the core voltage driver 601 is disabled and the voltage of the node N1 is gradually elevated in response to the power supply VDD. A range a1 in FIG. 7 indicates a range where the first step-up means 602 is operated. Because the PMOS transistor P1 of the first core voltage step-up means 602 is sized small, the voltage of the node N1 will be raised along a slow slope. In the prior art, power noise may occur as shown in FIG. 3 as only the core voltage step-up means 302 is operated when the sense amplifier is enabled. However, the present invention provides the first core voltage step-up means 602 which elevates the voltage of the node N1 substantially up to the level of the power supply VDD in response to the bank active signal BANK ACTIVE before the sense amplifier is enabled. This prevents overdriving as a result, even though the second core voltage step-up means 603 is operated when the sense amplifier is enabled. Therefore, power noise may hardly occur even though the second core voltage step-up means 603 is operated.

Then, where the second core voltage step-up means 602 is enabled upon application of the sense amplifier enable-signal S/A Enable, the voltage of the node N1 approaches to the power supply VDD. A range a2 in FIG. 7 indicates a range where the second core voltage step-up means 603 is operated. The PMOS transistor P2 of the second core voltage step-up means 603 is designed at a relatively large size so that the voltage of the node N1 will approach to the power supply VDD in a short time. Therefore, sense amplification can be carried out stably within a short time period.

Figure 5:
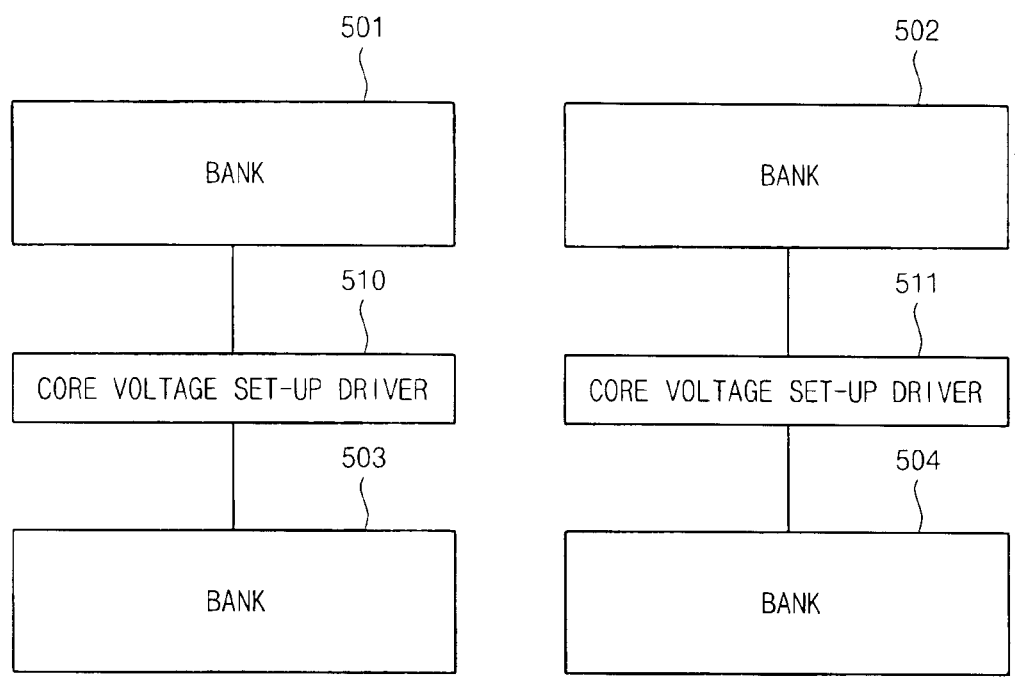
FIG. 5 illustrates an arrangement of core voltage step-up drivers in use for conventional memory banks.
Figure 8:
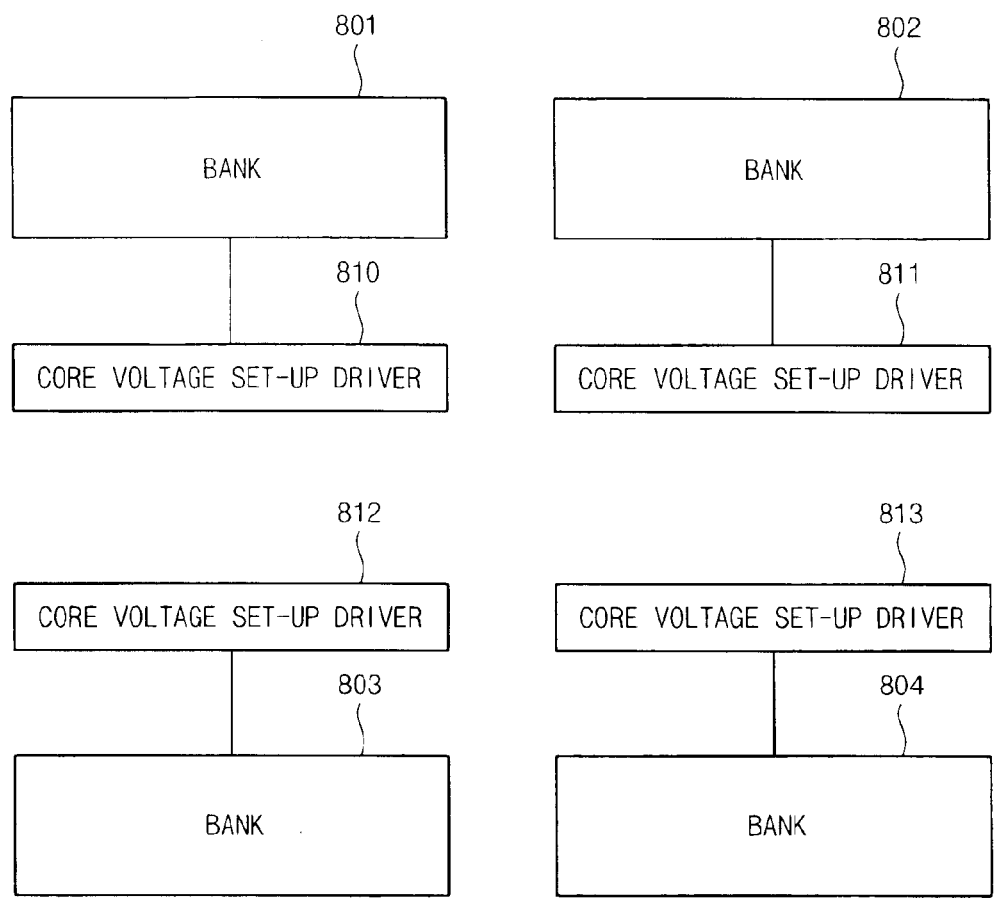
FIG. 8 illustrates an arrangement of core voltage step-up drivers of the invention applied to memory banks.

FIG. 8 illustrates an arrangement of core voltage step-up drivers of the invention applied to memory banks 801, 802, 803 and 804. In FIG. 8, each of the core voltage step-up drivers 810, 811, 812 and 813 corresponds to the core voltage step-up driver shown in FIG. 6. As shown in FIG. 8, the each core voltage step-up driver is arranged in one-on-one correspondence to each of the banks. Therefore, the arrangement of the core voltage step-up drivers according to the invention can reduce power consumption more than the prior art driving two banks (refer to FIG. 5).

As set forth above, the apparatus for generating a driving voltage for a sense amplifier of the invention can enhance the performance of the sense amplifier as well as execute detection amplification in a short time period.

Further, the invention employs the first and second core voltage step-up means which are turned on in sequence to elevate the core voltage functioning as the driving, voltage thereby reducing power noise.

Moreover, according to the invention, each of the core voltage step-up drivers for generating a driving voltage for a sense amplifier may be installed in each of the banks to reduce power consumption.

What is claimed is:

1. An apparatus for generating a driving voltage for a sense amplifier in a memory device, the apparatus comprising:

voltage output means for outputting a predetermined value of voltage for driving the sense amplifier to a node being used as a driving voltage node of the sense amplifier;

a first core voltage step-up means connected between a power supply and the node; and a second core voltage step-up means connected between the power supply and the node, wherein the first core voltage step-up means is turned on to elevate the voltage level of the node up to the level of the power supply at a first rate, and wherein, any time after the first core voltage step-up means is initially turned on, the second core voltage step-up means is turned on to elevate the voltage level of the node up to the level of the power supply at a second rate.

2. The apparatus as set forth in claim 1, wherein the first core voltage step-up means includes a first transistor, the second core voltage step-up means includes a second transistor, the first core voltage step-up means is enabled in response to a bank active signal, and the second core voltage step-up means is enabled in response to a sense amplifier enable-signal.

3. The apparatus as set forth in claim 2, wherein the first transistor is smaller-sized than the second transistor.

4. The apparatus as set forth in claim 2, wherein the voltage output means are inoperative when the first core voltage step-up means is enabled.

5. The apparatus as set forth in claim 1, wherein the voltage output means are arranged corresponding to each of banks in the memory device.

6. The apparatus as set forth in claim 1, wherein the second rate is faster than the first rate.

* * * * *